United States Patent [19]

Mittelberg

[11] Patent Number: 5,231,317
[45] Date of Patent: Jul. 27, 1993

[54] CIRCUIT ARRANGEMENT FOR STEEPENING SIGNAL SLOPES

[75] Inventor: Achim Mittelberg, Wedel, Fed. Rep. of Germany

[73] Assignee: U.S. Philips Corporation, New York, N.Y.

[21] Appl. No.: 672,709

[22] Filed: Mar. 18, 1991

[30] Foreign Application Priority Data

Mar. 27, 1990 [DE] Fed. Rep. of Germany ....... 4009730

[51] Int. Cl.[5] .................. G01R 19/12; H03K 5/12; H03K 5/22; H04N 9/64
[52] U.S. Cl. ................. 307/517; 307/529; 307/263; 307/268; 328/114; 358/37
[58] Field of Search ............ 328/114, 127, 129.1, 328/185, 187, 55; 358/37, 40; 307/263, 268, 227, 228, 517, 362, 529

[56] References Cited

U.S. PATENT DOCUMENTS 4,729,014 3/1988 Flamm et al. .................. 358/40

Primary Examiner—Stanley D. Miller
Assistant Examiner—Trong Phan
Attorney, Agent, or Firm—Edward W. Goodman

[57] ABSTRACT

In a circuit arrangement for steepening signal slopes of a digital signal in the form of a sequence of amplitude-discrete sampling values of an analog signal, the digital signal to be steepened is applied to a slope detector (1) which supplies a marking signal during the period in which a slope of the digital signal exceeds a given steepness value, which marking signal marks the sequence including the slope of the digital signal to be steepened, while a delay circuit (5) is provided in which the digital signal and the marking signal are delayed by a fixed period of time whose duration is longer than the maximum period of the sequences to be steepened, and a FIFO memory (6) is provided into which the amplitude value of the digital signal is entered at the instant of the end of the non-delayed sequence and from which memory the value is read at the instant of the start of the delayed sequence, and a sequence generator (8, 22) is provided which generates a steepened signal while taking account of the delayed digital signal, the delayed marking signal and the value read from the FIFO memory (6) and substitutes it for the original sequence of the signal by a multiplexer (12) in at least a part of the detected sequence of the delayed digital signal.

9 Claims, 2 Drawing Sheets

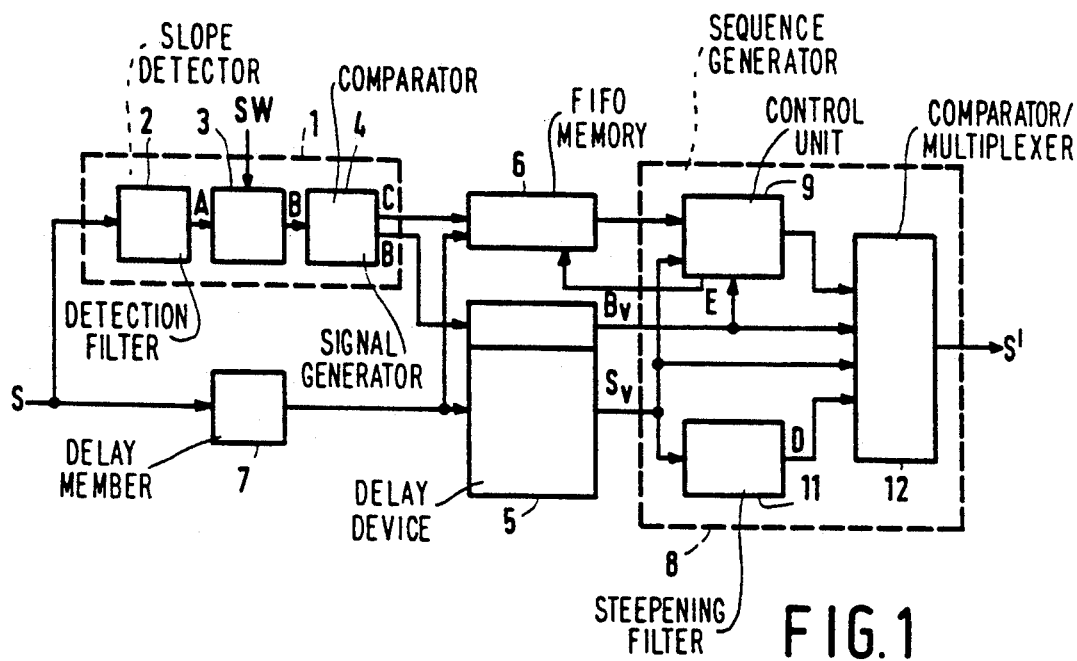
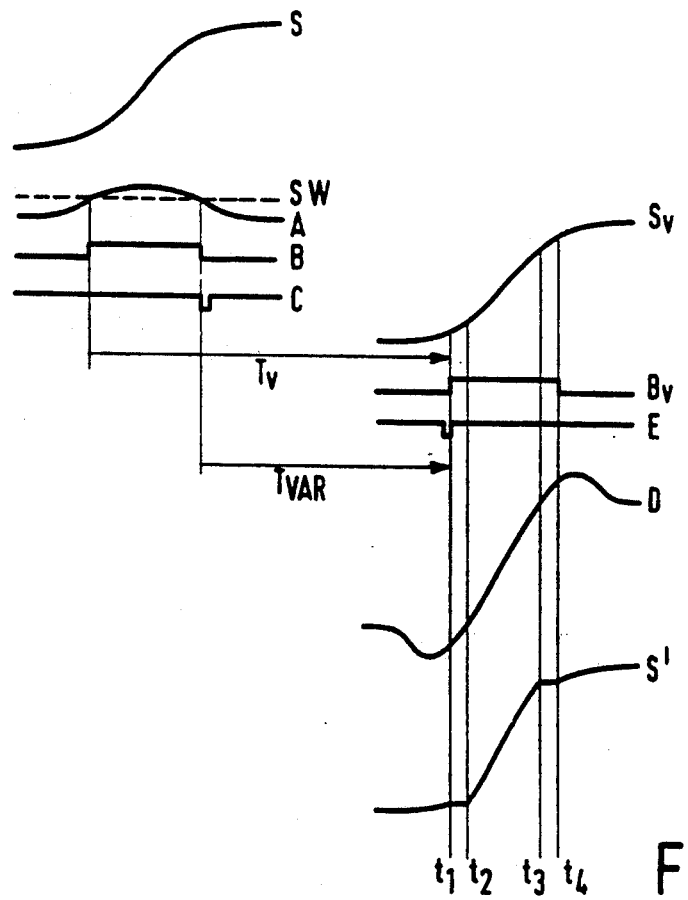

CIRCUIT ARRANGEMENT FOR STEEPENING SIGNAL SLOPES

BACKGROUND OF THE INVENTION

1. Field of the Invention

The invention relates to a circuit arrangement for steepening signal slopes of a digital signal in the form of a sequence of amplitude-discrete sampling values of an analog signal.

2. Description of the Related Art

A circuit arrangement for enhancing the sharpness of colour edges in which the shape of the luminance signal is utilized to steepen signal slopes of the chrominance signal is known from DE-C 35 41 103. To this end the steepness of the luminance signal is determined and a counter is activated when a given steepness value is exceeded. During the period in which the counter continues to count, a prefixed value of the color difference signal is released, independently of the continuous variations of the chrominance signal. After counting a given number of clocks, the actual color difference signal value is released again. Thus, starting from the initial amplitude of the signal, there is a direct change-over to the final value. Such a circuit arrangement is particularly unable to adapt to varying signal characteristics. For example, the length of a signal slope, or its steepness, is not taken into account. Moreover, particularly in the case of signal slopes having a relatively low frequency, i.e. those having a relatively long rise time, a signal alienation is to be taken into account because these slopes are also subjected to the steepening operation. However, the fundamental problem of the known circuit arrangement is that it operates in conjunction with the luminance signal, so that color variations which are not caused by a variation of the luminance signal cannot be steepened.

SUMMARY OF THE INVENTION

It is an object of the invention to provide a circuit arrangement in which the above-mentioned problems do not occur.

According to the invention, this object is solved in that the digital signal to be steepened is applied to a slope detector which supplies a marking signal during the period in which a slope of the digital signal exceeds a given steepness value, which marking signal marks the sequence including the slope of the digital signal to be steepened, in that a delay circuit is provided in which the digital signal and the marking signal are delayed by a fixed period of time whose duration is longer than the maximum period of the sequences to be steepened, in that a FIFO memory is provided into which the amplitude value of the digital signal is entered at the instant of the end of the non-delayed sequence and from which memory said value is read at the instant of the start of the delayed sequence, and in that a sequence generator is provided which generates a steepened signal while taking account of the delayed digital signal, the delayed marking signal and the value read from the FIFO memory and substitutes it for the original sequence of the signal by means of a multiplexer in at least a part of the detected sequence of the delayed digital signal.

Thus, in this circuit arrangement only the signal to be steepened is utilized for detecting a slope in the signal to be steepened, rather than a corresponding signal such as, for example, a luminance signal of a color television signal which is utilized for steepening one or more chrominance signals.

The digital signal to be steepened is applied to a slope detector. This slope detector determines when the signal exceeds a predetermined steepness value. During the period in which the signal exceeds this predetermined value, the slope detector supplies a marking signal. This signal thus marks that sequence in which a slope of the signal to be steepened is present.

Both the signal to be steepened and the marking signal generated by the slope detector are applied to a delay device in which they are delayed by a fixed period of time. The choice of this period of time is dependent on the maximum length of the sequences in which slopes are to be steepened. For example, when steepening chrominance signals of a color television signal, the band limitation to which the chrominance signals are previously subjected is known. Steepening in the range of this band limitation will be particularly desirable. Steepening will not be necessary in the lower frequency ranges of the chrominance signal, which are substantially not affected by the band limitation, so that the maximum period of time of the frequencies to be steepened already results from these criteria.

Furthermore, a so-called FIFO memory is provided which has the feature that data which have been serially entered into it are read out in the same sequence again. The actual amplitude value of the digital signal is entered into this FIFO memory, i.e. this amplitude value is determined and stored in the FIFO memory at the instant of the end of the non-delayed sequence, i.e. at the instant when the marking signal ends.

The values of the signal to be steepened and of the marking signal which are entered into the delay device are read out again after the fixed delay period. During this read period, it is determined, for example by means of the delayed marking signal, when the delayed sequence starts. As soon as this instant is reached, the previously entered value of the signal to be delayed is read from the FIFO memory. Thus, at the start of the delayed sequence, both the delayed signal to be steepened, the delayed marking signal and the final value which the digital signal to be steepened will assume at the end of the sequence are available.

These signals are now further processed in a sequence generator which generates a steepened shape of the signal in the period of time indicated by the delayed marking signal. In the simplest case this may be effected, for example, by a digital filter. Furthermore, the sequence generator includes a multiplexer which changes over from the delayed digital signal, i.e. the unchanged digital signal, to the steepened digital signal with reference to the period of time indicated by the delayed marking signal. In this case it is not absolutely necessary for this change-over to be effected during the entire period of time indicated by the marking signal; dependent on its use it may also be advantageous to change over to the initial value or the final value of the signal to be steepened at the start or the end, respectively, of the sequence and to change over to the steepened signal only in the middle of the marked sequence.

This circuit arrangement has the particular advantage that it is only oriented towards the values of the signal to be steepened and not towards other corresponding signals. When steepening a chrominance signal of a color television signal, slopes which are present in the chrominance signal but do not appear as corresponding slopes in a luminance signal are also detected. Since the picture gives the optical impression that particularly these slopes are considerably blurred due to the strong band limitation of the chrominance signals, the circuit arrangement can be advantageously effective in this case.

Moreover, the circuit arrangement does not change over between given initial values and final values of the signal, but it generates a steepened shape of the original signal in the period of time of the detected sequence. Thus, different signal shapes of the original signal are taken into account, and the result is not only a simple change-over between given values. Consequently, an essentially higher signal fidelity as compared with a simple change-over between two values is realized. A further advantage of the circuit arrangement is that it orients itself by the length of the slope to be steepened, i.e. by its rise time, and that it adapts the steepening of the signal to this length.

The circuit arrangement operates with a fixed delay from the input to the output, which delay can be taken into account for other signals which may have to be parallel processed.

According to an embodiment of the invention, the digital signal can be steepened advantageously in that the steepened signal is generated in the sequence generator by adding the delayed digital signal to its second derivative. This mode of generating the steepened signal particularly provides the possibility of determining the extent of the desired steepening such that, in accordance with a further embodiment of the invention, the two signal portions can be weighted during the addition. The user of a television receiver can perform this weighting operation for steepening a chrominance signal and in dependence upon the desired impression of the definition.

According to a further embodiment, the two signal portions are weighted in dependence upon the extent of the desired steepness of the slope.

In most ranges of application, the signal slopes of the digital signal are steepened for the purpose of approximately compensating for a previously performed band limitation of the signal. For example, a chrominance signal of a color television signal is subjected to a very strong band limitation. It is now desirable to steepen the signal, particularly in the frequency range located slightly below the upper band limit. On the other hand, steepening is not desirable in the lower frequency range of the signal, because the signal in this frequency range has not been essentially changed due to the band limitation. The circuit arrangement according to the invention provides the possibility of steepening the signal in dependence upon the sequence length indicated by the marking signal and consequently upon the rise time of the signal to be steepened. Thus, those signal portions whose frequencies are located relatively close to the band limit can be steepened to a stronger extent than other signal portions which are hardly affected by the band limitation. It is of course also possible to steepen only those signals which are located relatively close to the band limit as regards frequency and to pass the signal portions of a lower frequency through the circuit arrangement in an unchanged form.

In this respect the circuit arrangement can be adapted to signals which are used in many fields or to differently band-limited signals.

According to a further embodiment of the invention, the sequence generator includes a comparator which compares the steepened signal with the initial value of the delayed digital signal and with the final value read from the FIFO memory during the sequence indicated by the delayed marking signal and only causes the multiplexer to change over to the steepened signal when this signal has an amplitude value between the initial value and the final value, and in that during the other parts of the sequence indicated by the marking signal, the multiplexer changes over to the initial value during the first half of this sequence and to the final value during its second half.

Thus, according to this embodiment, the signal to be steepened is not automatically replaced by the steepened signal during the period of time indicated by the delayed marking signal. In fact, during this period of time the steepened signal is compared with the initial value of the delayed digital signal, which it has at the start of the sequence, and with the final value of the digital signal read from the FIFO memory. The steepened signal replaces the original signal in the sequence only when this comparison reveals that the value of the signal to be steepened is between the initial value and the final value of the digital signal. However, if the value of the steepened signal is not between the initial value and the final value of the digital signal, the multiplexer does not change over to the steepened signal during these periods of time but it includes the initial value or the final value in the signal. During the first half of the sequence, the initial value instead of the steepened signal is selected, whereas the final value is selected during the second half.

The signal leaving the multiplexer is thus produced in such a way that the multiplexer changes over to the delayed original signal before the start of the sequence, indicated by the delayed marking signal. At the start of the sequence the comparator checks whether the steepened signal is in the range between the initial value and the final value. If this is not the case, the multiplexer changes over to the initial value of the signal. As soon as the steepened signal reaches this initial value, the multiplexer changes over to the steepened signal. When this steepened signal leaves the range between the initial value and the final value of the signal in the course of the sequence as regards its amplitude value, the multiplexer changes over to the final value of the signal, which value has been read from the FIFO memory. At the end of the sequence indicated by the delayed marking signal, the multiplexer again changes over to the delayed, non-steepened signal.

This arrangement has the particular advantage that overshoots in the steepened signal generated in the sequence generator cannot reach the output of the multiplexer and hence the circuit arrangement. The circuit arrangement thus has ideal properties, because the original shape of a slope is replaced by a steepened slope in the sequence and because the overshoots at the beginning and the end, which inevitably occur when generating such steepened slopes, are suppressed. The overshoots are suppressed in that there is a change-over to the initial value or the final value during these periods. For example, if the circuit arrangement is used for steepening a chrominance signal of a color television signal, the optical impression is much more favorable than with steepened slopes having overshoots, because overshoots can particularly cause color contamination.

According to a further embodiment of the invention the sequence generator determines which direction the signal slope within the sequence will take by comparing the final value read from the FIFO memory with the initial value of the delayed digital signal, which sequence generator continuously compares two consecutive values of the steepened signal generated therein and each time replaces the second comparison value in the steepened signal by the first value in so far as the second value does not deviate from the first value as regards the direction of the signal slope.

In practical applications, it may occur that the signal to be steepened is superimposed with a noise signal. In unfavorable cases, this may have the result that the steepened signal generated in the sequence generator does not vary monotonically in the range of the slope to be steepened. Such signal shapes are, however, undesirable, because they particularly do not correspond to the original shape of the slope. Such disturbances in the generated slope can be suppressed in that, by comparison of the final value read from the FIFO memory with the initial value of the delayed digital signal, the sequence generator determines which direction the signal slope within the sequence will take, i.e. whether it is rising or falling. Moreover, the sequence generator compares two consecutive values of the steepened signal generated in this generator. The comparison of these signals directly shows whether a slope having the desired shape is detected. If it has been determined in advance by comparison of the initial and final values that the slope is rising, the second comparison value must in any case be equal to or larger than the first comparison value. Conversely, the second comparison value must be equal to or smaller than the first value in the case of a falling slope. If these conditions are not satisfied, the second comparison value is replaced by the first in the sequence generator, i.e. the first comparison value is maintained. There is a change-over again to the actual values of the signal steepened in the sequence generator only when the comparison values mark the rising or falling slope in the desired manner. The above-mentioned unsteady states in the steepened signal generated by the sequence generator are thus no longer present in the output signal of the circuit arrangement.

Instead of generating the steepened signal by means of adding up the second derivative, an embodiment of the invention is characterized in that an information signal is entered into the FIFO memory at the instant of the end of the non-delayed sequence, which information signal indicates the duration of the sequence, in that the sequence generator generates the steepened signal by means of at least a counter which is set to a suitable initial value at the start of the sequence by means of the information signal read from the FIFO memory, in that the counter continues to count with each new sampling value during the sequence, in that various counts are decoded and in that suitably weighted differences of the initial value and the final value of the signal to be steepened are generated by means of an arithmetic unit at the decoding instants, said differences representing the steepened signal.

In this embodiment of the sequence generator, an artificial signal slope is generated by means of the counter and the differently weighted differences of the initial value and the final value. To this end it is necessary that at the start of the delayed sequence not only the initial value and the final value of the signal to be steepened are known, but also the length of the sequence. This sequence length, which can be determined, for example, by means of the slope detector, and the final value of the digital signal are therefore entered into the FIFO memory. This signal as well as the final value is read out at the start of the delayed sequence and serves for setting a counter in the sequence generator at the start of the sequence in dependence upon its length. During the period of this sequence, this counter counts down, for example, at each new sampling value of the digital signal to be steepened. The counts of this counter are decoded so that given decoding signals are present at given instants whose locations in the sequence are known. These signals are employed to generate differently weighted differences of the initial value and the final value which constitute the steepened shape of the signal. At the start of the sequence these differences will be such that the initial value dominates, whereas the final value dominates at the end of the sequence. Dependent on the design, a very fine graduation can be realized between these values. In this embodiment of the sequence generator, an artificial slope is generated and introduced into the original signal during the detected sequence which is indicated by the marking signal. Also when this artificial sequence is generated, an adaptation to the initial and final values and particularly to the rise time or to its length is required.

According to further embodiments of the invention, the first derivative of the signal to be steepened is formed in the slope detector, which signal determines the value of the first derivative and is compared with a threshold value, and the slope detector generates the marking signal during those periods in which the value of the first derivative exceeds the threshold value whose level is continuously varied in dependence upon the level of the amplitude variations in the signal to be steepened.

In this way the slope detection is adapted quasi-continuously to the height of the signal slopes to be steepened.

BRIEF DESCRIPTION OF THE DRAWINGS

Two embodiments of the invention will now be described in greater detail with reference to the accompanying drawings, in which:

FIG. 1 is a block diagram of a first embodiment of the circuit arrangement including a sequence generator in which the steepened signal is generated by means of forming the second derivative;

FIG. 2 shows signal characteristic curves of the circuit arrangement of FIG. 1 as a function of time;

DESCRIPTION OF THE PREFERRED EMBODIMENTS

Figure 3:
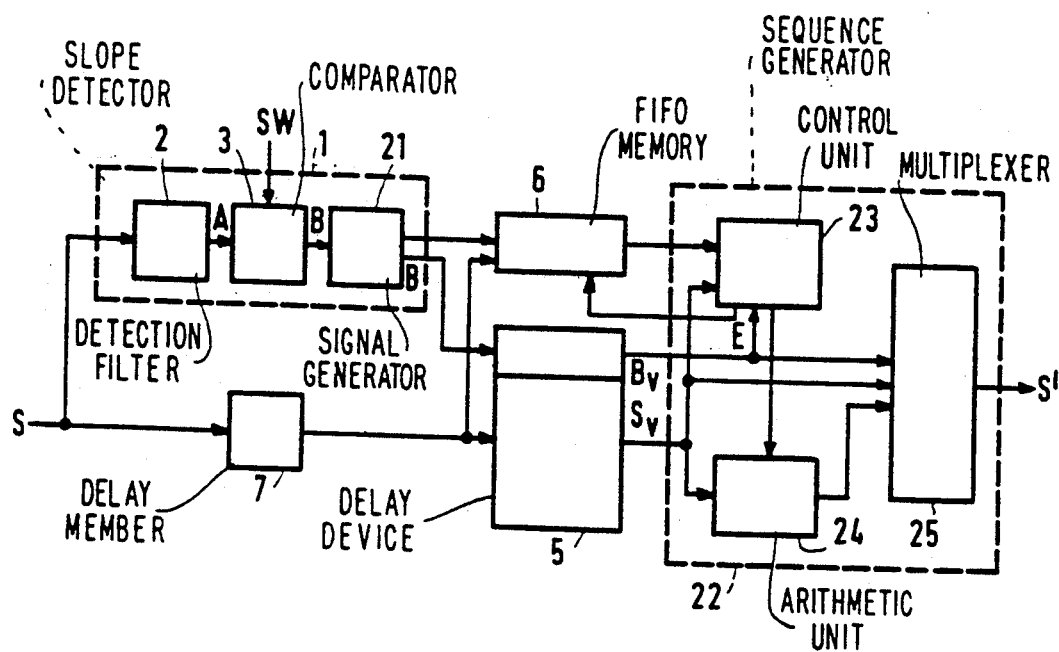
FIG. 3 is a block diagram of a second embodiment of the circuit arrangement in which the sequence generator includes, inter alia, a counter and an arithmetic unit.

A first embodiment of a circuit arrangement for steepening digital signals shown in a block diagram in FIG. 1 is used for steepening a chrominance signal of a color television signal. This chrominance signal S is a digital signal which is present as a sequence of amplitude-discrete n-bit wide binary coded sampling values of an analog signal.

In the circuit arrangement according to FIG. 1, this digital chrominance signal S is applied to a slope detector 1. Within the slope detector 1 the signal first reaches a detection filter 2 in which the first derivative of the digital signal S is formed and in which subsequently the value of this first derivative is formed. After formation of its value this first derivative is applied to a comparator 3 in the slope detector 1. Moreover, a threshold value signal SW, whose generation is not further shown in FIG. 1, is applied to the comparator 3. The value of the first derivative is compared with this threshold value SW in the comparator 3. During the periods when the value of the first derivative exceeds the threshold value SW, the comparator 3 generates a marking signal which is applied to a signal generator 4 in the slope detector 1. This signal generator 4 applies the marking signal to a delay device 5 and also generates a signal pulse which coincides with the end of the marking signal. This marking pulse is applied to a FIFO memory 6. The FIFO memory 6 is a memory in which data can be entered in a serial form and which can be serially read out again in the same sequence.

The digital chrominance signal S is also applied to a delay member 7 which serves to delay the digital signal S by the same value as that by which the marking signal is delayed in the slope detector 1. This signal S to be steepened and delayed by the delay member 7, as well as the marking signal leaving the slope detector 1 are applied to the delay device 5. In this delay device 5 the two signals are delayed by a fixed period of time. The length of this period of time is dependent on the maximum length of the sequences to be steepened.

The output signal of the delay member 7 is also applied to the FIFO memory 6. The signal generated by the signal generator 4 of the slope detector 1 at the instant of the end of the marking signal serves to enter the actual value of the digital chrominance signal S delayed by means of the delay member 7 into the FIFO memory 6. Thus, the actual amplitude value of the digital chrominance signal S is stored in the FIFO memory 6 at the end of the sequence.

The circuit arrangement of FIG. 1 further includes a sequence generator 8. This sequence generator 8 has a control unit 9 in which the initial value and the direction of the slope in the sequence are determined, as well as a steepening filter 11 and a comparator and multiplexer 12. These elements of the sequence generator 8 are arranged as follows.

The output signal of the FIFO memory 6 as well as the delayed marking signal supplied by the delay device 5 are applied to the control unit 9. The control unit 9 generates a pulse from the delayed marking signal, which pulse marks the start of the delayed sequence. This signal serves to read the previously entered final value of the signal from the FIFO memory 6. At the start of the delayed sequence, the control unit 9 further determines the amplitude of the delayed digital signal $S_v$ supplied by the delay device 5, which signal is also applied to the control unit 9 for this purpose. Based on the initial value and the final value of the digital signal known in this manner, the control unit 9 determines the direction of the slope, i.e. whether the slope is rising or falling. These three data components are applied to the comparator and multiplexer 12. Furthermore, the delayed signals supplied by the delay device 5, namely the delayed marking signal and the delayed digital signal to be steepened are applied to the comparator and multiplexer 12. The delayed digital signal is also applied to the steepening filter 11 which forms the second derivative of the signal and adds it to the original signal. This steepened signal thus obtained is also applied to the comparator and multiplexer 12.

The operation of the circuit arrangement shown in a block diagram in FIG. 1 will hereinafter be described in greater detail with reference to some signal characteristic curves shown in FIG. 2 as a function of time.

FIG. 2 shows a rising slope of the digital chrominance signal S in a quasi-analog form. Actually, the digital chrominance signal S comprises separate, time-discrete sampling values each having a width of several bits. In FIG. 2 this signal is shown in a quasi-analog form for the sake of clarity only.

In the circuit arrangement of FIG. 1, this digital chrominance signal S is applied to the detection filter 2 in which the first derivative is formed and whose value is formed subsequently. This signal A, which represents the value of the first derivative of the digital signal S, is also shown in FIG. 2. This signal is compared with a threshold value SW in the comparator 3 of the arrangement of FIG. 1. During the periods when the signal S exceeds the threshold value SW, the comparator 3 generates a marking signal B which is also shown in FIG. 2. This marking signal B marks the time-location of the sequence which comprises the slope of the digital chrominance signal S to be steepened. The signal generator 4 of the slope detector 1 generates a pulse C at the instant of the end of the marking signal B, which pulse is shown in FIG. 2 and which serves to enter the actual amplitude value of the digital chrominance signal S into the FIFO memory 6 at this instant. Thus, this amplitude value is the value assumed by the digital chrominance signal S at the instant of the end of the detected sequence.

In the delay device 5 of FIG. 1, both the digital chrominance signal S which is present in discrete sampling values and the marking signal B supplied by the slope detector 1 are delayed by a fixed period of time which is denoted by $T_v$ in FIG. 2. After this fixed period of time, the delayed signals $S_v$ and $B_v$ are taken from the delay device 5 of FIG. 1, which signals represent the delayed digital signal S and the delayed marking signal B, respectively.

These two signals $S_v$ and $B_v$ are applied to the control unit 9 in the sequence generator 8. At the start of the sequence, i.e. at the start of the delayed marking signal $B_v$, the actual sampling value of the signal $S_v$ is fixed and retained. At this instant a pulse of a signal E is generated, which is also shown in FIG. 2. This signal E serves to read, at the instant of the start of the delayed sequence, the final value of the digital signal stored in the FIFO6. The final value was stored in the FIFO6 for a period denoted by $T_{VAR}$ in FIG. 2, whose length varies with the length of the detected sequence. Thus, both the actual initial value of the delayed digital signal and the final value which the digital signal will assume at the end of the delayed sequence are available in the control unit 9 in the sequence generator 8 at the start of the delayed sequence. The control unit 9 determines the direction of the slope from these two values, which slope is rising in the example shown in FIG. 2. These three values, i.e. the initial value of the digital signal, the final value of the digital signal and the direction of the slope are applied to the comparator and multiplexer 12 in the circuit arrangement of FIG. 1. Moreover, the delayed digital signal $S_v$ and the delayed marking signal $B_v$ are applied to the multiplexer 12. The signal $S_v$ is also applied to the steepening filter 11 in the sequence generator 8 which forms the second derivative of this signal and adds it to the delayed signal. The output of the steepening filter 11 thus supplies a steepened signal D which is shown in FIG. 2. This signal is also applied to the comparator and multiplexer 12.

The output of the comparator and multiplexer 12 supplies the delayed digital signal supplied by the delay device 5 until the instant when the marking signal $B_v$ occurs. The output signal S' of the comparator and multiplexer 12 thus follows the delayed original signal $S_v$ until this instant which is denoted as t1 in FIG. 2. The marking signal occurs at the instant t1 so that the comparator and multiplexer 12 first compares the steepened curve of the signal D with the initial and final values of the digital signal, which values are supplied by the control unit 9. Since the amplitude value of the steepened signal D at the instant t1 is not in the amplitude range between the initial and final values of the signal $S_v$ at the instants t1 and t4 in the example shown in FIG. 2, the comparator and multiplexer 12 changes over to the initial value of the digital signal. This value is retained until the instant t2. As from the instant t2 the amplitude value of the steepened signal D is between the initial values and the final value of the digital signal $S_v$. This applies until the instant t3. During this period of time the output of the comparator and multiplexer 12 supplies the steepened signal D as supplied to it by the steepening filter 11 in the sequence generator 8. As from the instant t3, however, the actual amplitude value of the steepened signal D is no longer between the initial and final values of the digital signal S. Consequently, the comparator and multiplexer 12 changes over to the final value of the digital signal S, which final value is supplied to it by the control unit 9. This applies until the instant t4, because the actual sampling value of the steepened signal D is outside the range between the initial and final values of the digital signal S throughout this period of time. At the instant t4 the end of the sequence is reached, which is marked by the delayed marking signal $B_v$. At this instant the comparator 12 therefore changes over to the delayed digital signal $S_v$ again.

The result is that the output signal S' of the comparator and multiplexer 12, which is also the output signal of the entire circuit arrangement, represents a steepened shape of the slope originally present in the digital signal S. It is to be noted that the period between t2 and t3 in FIG. 2 is shown to be relatively wide for the purpose of clarifying the process. Actually, this period of time will be shorter in proportion to the overall period of time t1 to t4 so as to achieve a maximal steepness. The steepened signal S' orients itself to the original shape of the signal S. For example, if the signal S had a shorter or longer slope, the output signal S' would be adapted accordingly. A particular advantage of the circuit arrangement is that the output signal S' has no overshoots which would produce disturbing color fringes, particularly in chrominance signals.

FIG. 3 shows a second embodiment of the circuit arrangement in a block diagram, which arrangement also comprises a slope detector 1, a delay device 5, a FIFO memory 6 and a delay member 7. The delay member 7 and the delay device 5 operate in the same way as the corresponding elements of the circuit arrangement of FIG. 1. In the slope detector 1, the detection filter 2 and the comparator 3 are also identical to the corresponding elements of the circuit arrangement of FIG. 1. In the circuit arrangement of FIG. 3 the slope detector 1 includes a signal generator 21 which, similarly as the signal generator 4 of the circuit arrangement of FIG. 1, generates a marking pulse at the end of the detected sequence. However, the signal generator 21 of FIG. 3 additionally generates a signal indicating the length of the marked sequence. At the instant of the end of the sequence, this signal, together with the actual sampling value, is entered into the FIFO memory 6.

The circuit arrangement of FIG. 3 includes a sequence generator 22 which is different from the sequence generator 8 of the circuit arrangement of FIG. 1. The sequence generator 22 of FIG. 3 includes a control unit 23 having, inter alia, a counter and a decoder both of which are not further shown in the Figure. Similarly as the control unit 9 of the circuit arrangement of FIG. 1, this control unit 23 determines the amplitude value of the delayed digital signal $S_v$ at the instant of the start of the delayed sequence supplied by the delay device 5. Moreover, the final value of the digital signal as well as the value of the sequence length supplied by the signal generator 21 are read from the FIFO memory 6 at the start of the sequence. Thus, the initial value of the digital signal $S_v$, its final value, as well as the length of the sequence are available as corresponding data in the control unit 23. Dependent on these values, a counter in the control unit 23 is set, which counter counts down at each new sampling value of the delayed digital signal $S_v$. Furthermore, a decoder is provided which decodes various counts and supplies corresponding signals to an arithmetic unit 24 which also forms part of the sequence generator 22. The control unit 23 also supplies the initial value and the final value of the digital signal at the start and the end of the sequence. Differently weighted differences of these two values are now formed in the arithmetic unit 24. Dependent on the decoded instant, these differently weighted differences are applied to a multiplexer 25 which is also included in the sequence generator 22.

The output of the multiplexer 25 provides the steepened signal S'. During the periods when no marking signal $B_v$ occurs, the multiplexer 25 supplies the delayed digital signal $S_v$ supplied as the output signal by the delay device 5. During a sequence marked by the marking signal $B_v$ the multiplexer 25 changes over to the values supplied by the arithmetic unit 24. During such a marked sequence the delayed original signal $S_v$ thus changes over to the values supplied by the arithmetic unit 24. In this way a sequence is quasi-introduced into the signal during this period of time.

Figure 4:
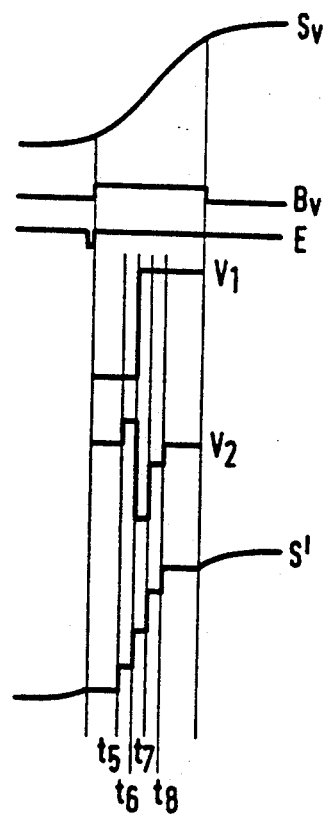
FIG. 4 shows some signal characteristic curves of the circuit arrangement of FIG. 3 as a function of time.

In conformity with FIG. 2, FIG. 4 shows a rising slope of a digital chrominance signal S in a quasi-analog form. The further signal shapes shown in FIG. 4 occur in the circuit arrangement of FIG. 3.

Since the circuit arrangement of FIG. 3 is not different from the circuit arrangement of FIG. 1 as far as generation of the marking signal, the FIFO memory 6 and the delay device 5 are concerned, the relevant signals are identical to the corresponding signals occurring in the circuit arrangement of FIG. 3. FIG. 4 shows the delayed signal $S_v$ which represents the delayed sequence of the signal to be steepened. The marking signal $B_v$ marking the corresponding sequence is also shown.

In the control unit 23 of FIG. 3, a signal is generated in a similar manner as in the control unit 9 of FIG. 1, which signal is denoted by E in FIG. 4 and which indicates the start of the sequence marked by the marking signal $B_v$. This signal is used to trigger the read-out of the values stored in the FIFO memory 6.

FIG. 4 also shows two signals $V_1$ and $V_2$ and a signal S' which is the output signal of the multiplexer 25 according to FIG. 3 and represents the steepened shape of the signal.

The two signals $V_1$ and $V_2$ occur within the arithmetic unit 24 of the circuit arrangement of FIG. 3.

As already noted, the control unit 23 includes a counter which is set at a suitable initial value and counts down at each new sampling value of the delayed digital signal $S_y$. Given counts are decoded and a corresponding signal is applied to the arithmetic unit 24 at the corresponding instant. In the example shown in FIG. 4, the decoded instants are referenced t5, t6, t7 and t8. At these instants the control unit 23 applies corresponding signals to the arithmetic unit 24. Suitably weighted differences between the initial value and the final value of the digital signal at the start and the end of the sequence are now generated in the arithmetic unit 24 in the periods of time between these instants. These weighted differences can be generated in different ways. In the example shown in FIG. 4 two signals $V_1$ and $V_2$ are superimposed. The signal $V_1$ is generated in such a way that, as from the start of the sequence until the instant t6, it assumes the initial value of the digital signal to be steepened, and that it assumes the final value of this signal from the instant t6 until the end of the sequence. A signal $V_2$ generated in the arithmetic unit 24 has the value of zero in the periods of time between the start of the sequence and the instant t5 and in the period of time between t8 and the end of the sequence. In the period of time between t5 and t6, a positive signal is generated in the example shown in FIG. 4, while a negative signal having a significantly larger amplitude is generated in the period of time between t6 and t7, and a negative signal having a smaller amplitude is generated in the period of time between t7 and t8. The signals $V_1$ and $V_2$ are superimposed in a manner which is not shown in FIG. 3.

During the period of time between t5 and t8, this superimposed signal is comprised in the signal S' which is shown in FIG. 4 in the form in which it occurs at the output of the multiplexer 25. However, in the period of time between the start of the sequence shown in FIG. 4 and the instant t5, and in the period of time between t8 and the end of the sequence, the signal S' assumes the initial value and the final value, respectively, of the signal to be steepened, as already described hereinbefore with reference to the first embodiment.

In the example shown in FIG. 4 with signals occurring similarly as in the arrangement of FIG. 3, the sequence S, $S_v$ to be steepened is thus distinctly steepened so that the signal transition or the signal slope only occurs in the narrow period of time between t5 and t8.

I claim:

1. A circuit arrangement for steepening signal slopes of a digital signal formed by a sequence of amplitude-discrete sampling values of an analog signal, characterized in that the circuit arrangement comprises:
   an input for receiving the digital signal to be steepened;
   a slope detector coupled to said input for detecting a slope of the received digital signal, said slope detector supplying a marking signal during a period in which a slope of the received digital signal exceeds a predetermined steepness value, said marking signal marking a sequence including the slope of the digital signal to be steepened;
   a delay circuit coupled to said input and to an output of said slope detector for delaying said received digital signal and said marking signal for a fixed period of time having a duration longer than the maximum period of the sequences to be steepened;
   a FIFO memory coupled to said input and to an output of said slope detector, said FIFO memory storing the amplitude value of the received digital signal at an end of said marked sequence, said amplitude value being read from said FIFO memory at the start of the marked sequence of said digital signal after being delayed in said delay circuit; and
   a sequence generator coupled to said delay circuit and said FIFO memory, said sequence generator comprising means for generating a steepened signal in dependence on the delayed digital signal, the delayed marking signal and the amplitude value read from said FIFO memory, and a multiplexer for receiving said delayed digital signal and said steepened signal, said multiplexer substituting said steepened signal for the marked sequence in said delayed digital signal for at least a part of the marked sequence of the digital signal detected in said slope detector.

2. A circuit arrangement as claimed in claim 1, characterized in that in said sequence generator, said means for generating a steepened signal comprises means for forming a second derivative of said delayed digital signal, and means for adding said second derivative of said delayed digital signal to said delayed digital signal.

3. A circuit arrangement as claimed in claim 2, characterized in that said adding means comprises means for weighting said delayed digital signal and said second derivative, said weighting being adjustable in dependence upon a desired amount of steepening.

4. A circuit arrangement as claimed in claim 3, characterized in that said weighting is adjusted in dependence on a length of the marked sequence of the digital signal to be steepened as indicated by the marking signal, whereby starting from a predetermined minimum sequence length, an amount of steepening becomes more gradual as the length of the marked sequence increases.

5. A circuit arrangement as claimed in any one of claims 1–4, characterized in that said sequence generator comprises means for receiving and storing the end amplitude value of the marked sequence stored in said FIFO memory and for storing the initial value of said marked sequence as received from said delay circuit, and a comparator, coupled to said receiving and storing means and said steepened signal forming means, for comparing the steepened signal with the initial value and the end value of the marked sequence, said comparator controlling said multiplexer whereby during a first half of the period of said marked sequence, at the beginning of said marked sequence, said multiplexer switches to supply said steepened signal if said steepened signal has an amplitude value in an amplitude range between the initial value and the end value, otherwise said multiplexer supplies the initial value until said steepened signal amplitude value is in said amplitude range, and during a second half of the period of said marked sequence, prior to the end of said marked sequence, said multiplexer supplies said steepened signal until said marked sequence amplitude value is in said amplitude range and then supplies said end value, after which, said multiplexer supplies said delayed digital signal.

6. A circuit arrangement as claimed in claim 5, characterized in that the sequence generator comprises means for determining a direction of the signal slope of the marked sequence by comparing the end amplitude value and the initial value, and means for continuously comparing two consecutive sample values in the steepened signal and for each time replacing a second of the two consecutive sample values by a first of the two consecutive samples when said second sample value does not deviate from said first sample value with regard to the direction of the signal slope of the marked sequence.

7. A circuit arrangement as claimed in claim 1, characterized in that said slope detector further comprises means for generating an information signal at the end of marked sequence indicating the duration of said marked sequence, said FIFO memory storing said information signal along with the end amplitude value of the received digital signal at the end of said marked sequence, and said sequence generator further comprises means for storing an initial value of said marked sequence received from said delay circuit, a counter coupled to receive said information signal from said FIFO memory as an initial counting value at the start of said marked sequence, said counter counting down from said initial counting value at each sampling instant during the marked sequence and supplying a counting value, and an arithmetic unit coupled to receive said marked sequence from said delay circuit, said counting value from said counter, said end value from said FIFO memory and said initial value from said storing means, said arithmetic unit generating said steepened signal as a weighted difference of said initial value and said end value, said weighted difference being adjusted each time in dependence on the counting value received from said counter.

8. A circuit arrangement as claimed in claim 1 or 7, characterized in that the first derivative of the signal to be steepened is formed in the slope detector, which signal determines the value of the first derivative and is compared with a threshold value, and in that the slope detector generates the marking signal during those periods in which the value of the first derivative exceeds the threshold value.

9. A circuit arrangement as claimed in claim 8, characterized in that the slope detector comprises means for continuously varying the level of the threshold value in dependence upon the level of the amplitude variations in the signal to be steepened.

* * * * *